(12) United States Patent
Gamm et al.

(10) Patent No.: US 7,158,582 B2
(45) Date of Patent: Jan. 2, 2007

(54) DIGITAL I/Q MODULATOR HAVING A PREDISTORTION

(75) Inventors: Eberhard Gamm, Erlangen (DE);
Reiner Retkowski, Erlangen (DE);
Gerald Ulbricht, Röthenbach (DE);
Heinz Gerhaeuser, Waischenfeld (DE)

(73) Assignee: Fraunhofer-Gesellschaft zur Foerderung der Angewandten Forschung E. V., Munich (DE)

( * ) Notice: Subject to any disclaimer, the term of this patent is extended or adjusted under 35 U.S.C. 154(b) by 845 days.

(21) Appl. No.: 10/221,636

(22) PCT Filed: Mar. 2, 2001

(86) PCT No.: PCT/EP01/02381

§ 371 (c)(1),
(2), (4) Date: Nov. 6, 2002

(87) PCT Pub. No.: WO01/69879

PCT Pub. Date: Sep. 20, 2001

(65) Prior Publication Data

US 2004/0013206 A1    Jan. 22, 2004

(30) Foreign Application Priority Data

Mar. 15, 2000    (DE) ................... 100 12 538

(51) Int. Cl.
*H04K 1/02*    (2006.01)
(52) U.S. Cl. .................. 375/296; 455/114.3; 398/193; 375/278; 375/284; 375/285
(58) Field of Classification Search ................ 348/266; 370/242, 290, 433; 375/245, 238; 327/359, 327/346; 704/223; 330/149
See application file for complete search history.

(56) References Cited

U.S. PATENT DOCUMENTS 3,603,739 A * 9/1971 Edson ..................... 370/433

(Continued)

FOREIGN PATENT DOCUMENTS

EP    0 982 849 A1    3/2000

(Continued)

OTHER PUBLICATIONS

M. Ghaderi et al.; Adaptive Predistortion Lineariser Using Polynomial Functions; Apr. 1994; IEE Proceedings—Communications; vol. 141; pp. 49-55.*

(Continued)

*Primary Examiner*—Mohammed Ghayour
*Assistant Examiner*—Adolf DSouza
(74) *Attorney, Agent, or Firm*—Gardner Groff Santos & Greenwald, PC

(57) ABSTRACT

An I/Q modulator processes a time-discrete I/Q signal comprising an I component and a Q component. The I/Q signal is based on a sampling frequency which is equal to four times a carrier frequency of a carrier signal onto which the I/Q signal is modulated. A predistorter of the modulator predistort the I and components with a predistortion signal, which depends on the I and Q components, so as to form a predistorted I component and, in temporal alternation therewith, a predistorted Q components. An adjuster of the modulator adjusts the signs of the predistorted I and Q components so that two temporally successive predistorted components have a first sign and two additional successive predistorted components, which follow the first-mentioned components in time, have a second sign which is the inverse of the first sign, so as to produce therefrom an output signal at an output of the modulator.

13 Claims, 8 Drawing Sheets

U.S. PATENT DOCUMENTS

| | | | | |
|---|---|---|---|---|
| 3,830,982 | A | * | 8/1974 | Christiansen .............. 370/242 |
| 4,345,270 | A | * | 8/1982 | Nagumo et al. ............ 348/266 |
| 4,969,144 | A | * | 11/1990 | Blackwell et al. .......... 370/290 |
| 5,049,832 | A | | 9/1991 | Cavers |
| 5,105,446 | A | * | 4/1992 | Ravoalavoson et al. .... 375/296 |
| 5,699,383 | A | * | 12/1997 | Ichiyoshi ................... 375/297 |
| 5,900,778 | A | * | 5/1999 | Stonick et al. ............. 330/149 |

FOREIGN PATENT DOCUMENTS

WO     PCT/IB99/01381     12/1999

OTHER PUBLICATIONS

James Cavers; Amplifier Linearization Using a Digital Predistorter with Fast Adaptation and Low Memory Requirements; Nov. 1990; IEEE Transactions on Vehicular Technology, vol. 39; pp. 374-382.*
International Preliminary Examination Report, dated Aug. 19, 2002.

* cited by examiner

DIGITAL I/Q MODULATOR HAVING A PREDISTORTION

FIELD OF THE INVENTION

The present invention relates to an I/Q modulator and, in particular, to an I/Q modulator for processing a time-discrete I/Q signal.

BACKGROUND OF THE INVENTION AND PRIOR ART

Conventional I/Q modulators are used in transmitting means for carrier-frequency transmission systems, e.g. transmitters for digital broadcasting, and in base stations for mobile communications.

One example of such a transmitting means is shown in FIG. 4. The transmitting means 400 comprises an I/Q modulator 402 with predistortion, the I/Q modulator 402 comprising a first input connected to the input of the transmitting means 400, and an output. The first input of the I/Q modulator has an I/Q signal applied thereto. The output of the I/Q modulator is connected to a first input of a first mixer 404. A second input 404 of the mixer is connected to an oscillator 406. An output of the mixer 404 is connected to an input of an amplifier 408. An output of the amplifier 408 is connected to an antenna 410. The amplifier 408 and the antenna 410 have arranged between them a decoupling means 412 which is connected to the input of an attenuator 414. An output of the attenuator 414 is connected to a first input of a second mixer 416. A second input of the second mixer 416 is connected to the oscillator 406. An output of the mixer 416 is connected to an input of an I/Q demodulator 418. An output of the I/Q demodulator 418 is connected to a first input of a comparator 420. A second input of the comparator 420 is connected to an output of a delay element 422. An output of the comparator 420 is connected to a second input of the I/Q modulator 402. An input of the delay element 422 is connected to the first input of the I/Q modulator 402. The decoupling means 412, the attenuator 414, the second mixer 416, the I/Q demodulator 418 and the comparator 420 define a feedback for determining the predistortion parameters.

In the following, the mode of operation of a transmitting means according to FIG. 4 will be described briefly. An I/Q signal, which is e.g. a message-carrying baseband signal comprising an I component and a Q component, is modulated onto a carrier signal by means of the I/Q modulator. In order to compensate distortions of the first mixer 404 and of the amplifier 408, the I/Q modulator carries out a predistortion of the I/Q signal in addition to the modulation. This is important especially when transmit signals with non-constant envelopes are used. The latter occur e.g. in cases in which amplitude-modulated instead of frequency-modulated signals are used so as to achieve a higher spectral efficiency of the modulation method. The non-constant envelope of the transmit signal causes in connection with the non-linearities of the first mixer 404 and of the amplifier 408 disturbances outside the useful frequency band. These disturbances are referred to as adjacent-channel emissions and should typically not exceed an application-specific limit value. The predistorted output signal of the I/Q modulator 402 is fed to the first mixer 404 in which the signal is up-converted with the aid of the oscillator 406. The up-converted signal is then amplified by the amplifier 408, e.g. a travelling wave tube, and sent to the antenna 410 and transmitted.

Part of the signal sent to the antenna 410 is previously tapped off by the decoupling means 412 and, for further processing, it is attenuated by the attenuator 414 so as to reverse the effect of the amplification of the amplifier 408. The tapped-off attenuated signal is fed to the second mixer 416 for down-conversion. The down-converted signal is fed to the I/Q demodulator so as to be demodulated into an I/Q signal. The demodulated I/Q signal now carries the information on the distortion caused in the original I/Q signal by the first mixer 404 and the amplifier 408. When this demodulated distorted I/Q signal is supplied to the comparator 420, the comparison between the original I/Q signal and the distorted I/Q signal will provide the information indicating what predistortion of the I/Q modulator has to be chosen so that the distortions caused by the first mixer 404 and the amplifier 408 can be compensated for in the best possible way.

A feature which is important to the comparison is that the original I/Q signal is delayed in time by the delay element 422 prior to the comparison in the comparator 420 so that the original I/Q signal is actually the signal which caused the predistorted I/Q signal. This method of adjusting the predistortion of the I/Q modulator 402 in dependence upon a comparison is referred to as adaptive predistortion.

An example of such an adaptive predistortion is described in U.S. Pat. No. 5,049,832. U.S. Pat. No. 5,049,832 discloses an amplifier linearization of an amplifier circuit by adaptive predistortion in the case of which an input signal for a power amplifier of the amplifier circuit is derived from an input modulation signal of the amplifier circuit by predistortion, i.e. the input signal of the power amplifier is predistorted so as to achieve a linear amplification of the input signal by the power amplifier.

The predistortion of the input modulation signal is adjusted via a table, which is addressed in dependence upon the square of the amplitude of the input modulation signal, the contents of the table being continuously updated so that, when the input modulation signal is being distorted, variations of the distortion caused by the power amplifier can be taken into account through the table.

FIGS. 5A and 5B show the components and FIG. 5C shows the overall configuration of a conventional I/Q modulator 500 with predistortion of the I/Q signal or baseband signal.

FIG. 5A shows means 502 for applying an I/Q signal or baseband signal, which comprises an I component and an Q component, to a carrier signal, which comprises a first subcomponent, in this case a cosine component, and a subcomponent, in this case a sine component, which is substantially orthogonal to this first subcomponent, so as to produce an output signal y(t).

$$y(t)=i(t)\cdot\cos \omega_0 t - q(t)\cdot\sin \omega_0 t \text{ with } \omega_0=2\pi f_0 \qquad \text{equa. 1}$$

Means 502 for applying an I/Q signal to a carrier signal comprises a first multiplier 506, a second multiplier 508, means 510 for producing a carrier signal and an adder 512.

The first multiplier 506 comprises a first input, which is a first input of the means 502 for applying an I/Q signal to a carrier signal and which has the I component of the I/Q signal applied thereto, a second input, which is connected to a first output of the means 510 for producing a carrier signal, and an output which is connected to a first input of the adder 512.

The second multiplier 508 comprises a first input, which is a second input of the means 502 for applying an I/Q signal to a carrier signal and which has the Q component of the I/Q signal applied thereto, a second input, which is connected to a second output of the means 510 for producing a carrier signal, and an output which is connected to an inverting second input of the adder 512.

The means 510 for producing a carrier signal produces a carrier signal which can be represented as a complex function in the following way:

$$e^{j\omega_0 t} = \cos \omega_0 t + j \sin \omega_0 t \qquad \text{equa. 2}$$

The first multiplier 506 multiplies the first subcomponent of the carrier signal by the I component of the I/Q signal, as can be seen from the first multiplication of equation 1, so as to obtain a multiplied I component, and the second multiplier 508 multiplies the second subcomponent of the carrier signal by the Q component of the I/Q signal so as to obtain a multiplied Q component, as can be seen from the second multiplication of equation 1.

The adder 512 forms subsequent to the first multiplier 506 and the second multiplier 508 the difference between the multiplied I component and the multiplied Q component, as shown in equation 1, so as to produce the output signal y(t) of the means 502 for applying an I/Q signal to a carrier signal.

Also the I/Q signal is now represented as a complex function.

$$\underline{x}(t) = i(t) + jq(t) \qquad \text{equa. 3}$$

The function of the means 502 for applying an I/Q signal to a carrier signal can be described by the following complex representation:

$$y(t) = \text{Re}\{\underline{x}(t) \cdot e^{j\omega_0 t}\} \qquad \text{equa. 4}$$

FIG. 5B shows a predistortion means 504 for predistorting an I/Q signal, i.e. an I component and a Q component of an I/Q signal. In a complex representation, the I/Q signal is predistorted by multiplication with a predistortion signal $$\underline{p}(t) = p_1(t) + jp_2(t) = \rho(t) \cdot e^{j\phi(t)} \qquad \text{equa. 5}$$

so as to obtain a predistorted I/Q signal.

$$\underline{x}_p(t) = \underline{x}(t) \cdot \underline{p}(t) = i_p(t) + jq_p(t) \qquad \text{equa. 6}$$

$$i_p(t) = i(t) \cdot p_1(t) - q(t) \cdot p_2(t) \qquad \text{equa. 7}$$

$$q_p(t) = i(t) \cdot p_2(t) - q(t) \cdot p_1(t) \qquad \text{equa. 8}$$

The predistortion means 504 comprises a first multiplier 514, a second multiplier 516, a third multiplier 518, a fourth multiplier 520, a first adder 522, a second adder 524, and means 526 for producing a predistortion signal.

The first multiplier 514 comprises a first input, which is connected to a first input of the predistortion means 504 and which has the I component of the I/Q signal applied thereto, and a second input, which is connected to a first output of the means 526 for producing a predistortion signal p(t) and which has applied thereto the first predistortion component $p_1(t)$ of the predistortion signal according to equation 5, and an output which is connected to a first input of the first adder 522.

The second multiplier 516 comprises a first input, which is connected to a second input of the predistortion means 504 and which has the Q component of the I/Q signal applied thereto, and a second input, which is connected to a second output of the means 526 for producing a predistortion signal and which has the second predistortion component $p_2(t)$ of the predistortion signal p(t) applied thereto, and an output which is connected to an inverting second input of the first adder 522.

The third multiplier 518 comprises a first input, which is connected to the second input of the predistortion means 504 and which has the Q component of the I/Q signal applied thereto, a second input connected to the first output of the means 526 for producing a predistortion signal, and an output connected to a first input of the second adder 524.

The fourth multiplier 520 has an input, which is connected to the first input of the predistortion means 504 and which has the I component of the I/Q signal applied thereto, a second input connected to the second output of the means 526 for producing a predistortion signal, and an output connected to a second input of the second adder 524.

An output of the first adder is a first output of the predistortion means 504 and an output of the second adder is a second output of the predistortion means 504.

The means 526 for producing the predistortion signal supplies at the first output the first component $p_1(t)$ of the predistortion signal $\underline{p}(t)$ and at the second output the second component $p_2(t)$ of the predistortion signal $\underline{p}(t)$ depending on the I component i(t) of the I/Q signal and on the Q component q(t) of the I/Q signal, the I component being applied to a first input of the means 526 for producing the predistortion signal and the Q component of the I/Q signal being applied to a second input.

In the following, the mode of operation of the predistortion means 504 shown in FIG. 5B will be described briefly. The first adder 522 has the function of forming the difference indicated in equation 7, the first multiplier 514 carrying out the first multiplication occurring in equation 7 and the second multiplier 516 carrying out the second multiplication occurring in equation 7. The second adder 524 has the function of forming the sum indicated in equation 8, the third multiplier 518 carrying out the second multiplication occurring in equation 8 and the fourth multiplier 520 carrying out the first multiplication occurring in equation 8.

FIG. 5c shows the overall configuration of the conventional I/Q modulator 500 with predistortion of the I/Q signal comprising the means 502 for applying an I/Q signal to a carrier signal according to FIG. 5A and the predistortion means 504 according to FIG. 5B.

The conventional I/Q modulator 500 according to FIG. 5C now supplies at its output, i.e. as a result of the addition of the adder 512, the following output signal:

$$y(t) = \text{Re}\{\underline{x}(t) \cdot \underline{p}(t) \cdot e^{j\omega_0 t}\} \qquad \text{equa. 9}$$

$$y(t) = \text{Re}\{\underline{x}_p(t) \cdot e^{j\omega_0 t}\} = i_p(t) \cdot \cos \omega_0 t - q_p(t) \cdot \sin \omega_0 t \qquad \text{equa. 10}$$

This is the predistorted I/Q signal modulated on a carrier signal.

FIG. 6 shows an I/Q modulator 600 with predistortion of the carrier signal. In contrast to the I/Q modulator according to FIGS. 5A, B, C, the carrier signal, instead of the I/Q signal, is now predistorted by a predistortion signal $\underline{p}(t)$ so as to obtain a predistorted carrier signal.

$$\underline{t}_p(t) = \underline{p}(t) \cdot e^{j\omega_0 t} = \rho(t) \cdot e^{j[\omega_0 t + \phi(t)]} \qquad \text{equa. 11}$$

For an I/Q modulator with predistortion of the carrier signal, the output signal of this I/Q modulator is obtained on the basis of equation 9 and equation 11.

$$y(t) = \text{Re}\{\underline{x}(t) \cdot \underline{t}_p(t)\} \qquad \text{equa. 12}$$

$$= i(t) \cdot \rho(t) \cdot \cos[\omega_0 t + \phi(t)] - q(t) \cdot \rho(t) \cdot \sin[\omega_0 t + \phi(t)]$$

The I/Q modulator 600 in FIG. 6 comprises a first multiplier 602, a second multiplier 604, a third multiplier 606, a fourth multiplier 608, means 610 for producing a carrier signal, an adder 612 and means 614 for producing a predistortion signal.

The first multiplier 602 comprises a first input, which is connected to a first input of the I/Q modulator 600 and which has the I component i(t) of the I/Q signal applied thereto, a second input connected to an output of the second multiplier 604, and an output connected to a first input of the adder 612.

The second multiplier 604 comprises a first input, which is connected to a first output of the means 614 for producing a predistortion signal and which has the magnitude ρ(t) of the predistortion signal p(t) applied thereto, and a second input, which is connected to a first output of the means 610 for producing a carrier signal and which has a first subcomponent of the carrier signal, here a cosine function, applied thereto, and the output which is connected to the second input of the first multiplier 602.

The third multiplier 606 comprises an input, which is connected to a second input of the I/Q modulator 600 and which has the Q component q(t) of the I/Q signal applied thereto, a second input connected to an output of the fourth multiplier 608, and an output connected to an inverting second input of the adder 612.

The fourth multiplier 608 comprises a first input, which is connected to a first output of the means 614 for producing a predistortion signal and which has the magnitude ρ(t) of the polar predistortion signal p(t) applied thereto, a second input, which is connected to a second output of the means 610 for producing a carrier signal and which has a second subcomponent of the carrier signal, here the sine function, applied thereto, and the output which is connected to the second input of the third multiplier 606.

The means 610 for producing a carrier signal comprises the above-mentioned first and the above-mentioned second output, which have applied thereto the first and second subcomponents of the carrier signal, here the cosine and sine components, and an input, which is connected to a second output of the means 614 for producing the predistortion signal and which has the phase φ(t) of the polar predistortion signal applied thereto.

Depending on at least the I component i(t) of the I/Q signal at a first input of the means 614 for producing a predistortion signal, which is connected to the first input of the I/Q modulator 600, and the Q component q(t) of the I/Q signal at a second input of the means 614 for producing a predistortion signal, which is connected to the second input of the I/Q modulator 600, the means 614 for producing a predistortion signal supplies at the first output thereof the magnitude ρ(t) of the predistortion signal p(t) and at the second output thereof the phase φ(t) of the predistortion signal p(t).

In the following, the mode of operation of the I/Q modulator 600 with predistortion of the carrier signal according to FIG. 6 will be described briefly. The adder 612 has the function of forming the difference in equation 12. The first summand of equation 12 is produced by the first multiplier 602 and the second multiplier 604 and the second summand of equation 12 is produced by the third multiplier 606 and the fourth multiplier 608.

The second multiplier 604 performs the second multiplication of the first summand of equation b 12, i.e. the multiplication of the first subcomponent of the carrier signal with the magnitude of the predistortion signal, so as to produce a predistorted first subcomponent of the carrier signal, whereas the first multiplier 602 performs the first multiplication of the first summand of equation 12, i.e. the multiplication of the predistorted first subcomponent of the carrier signal with the I component of the I/Q signal.

The fourth multiplier 608 performs the second multiplication of the second summand of equation 12, i.e. the multiplication of the second subcomponent of the carrier signal with the magnitude of the predistortion signal, so as to obtain a predistorted second subcomponent of the carrier signal, and the third multiplier 606 performs the first multiplication of the second summand of equation 12, i.e. the multiplication of the predistorted second subcomponent of the carrier signal with the Q component of the I/Q signal.

One disadvantage of the conventional I/Q modulator 500 with predistortion of the I/Q signal according to FIGS. 5A, B, C, and of the I/Q modulator 600 with predistortion of the carrier signal according to FIG. 6 is that six and four multipliers, respectively, are required for realizing the I/Q modulators in circuitry. In the case of modern transmitting means the predistortion and the I/Q modulations are carried out digitally i.e. in a time-discrete manner. In view of the large bandwidth and the high precision demands of modern transmission methods, such as e.g. W-CDMA (CDMA=Code-Division Multiple Access), expensive, fast, digital multipliers having a high resolution of typically 14 bits are required for this purpose.

Another disadvantage is that, in view of the high numbers of multipliers, the number of gates and the power consumption of the conventional I/Q modulators according to FIGS. 5A, 5B, 5C and according to FIG. 6 are very high.

SUMMARY OF THE INVENTION

It is the object of the present invention is to provide a simplified I/Q modulator for processing a time-discrete I/Q signal and a simplified method of processing a time-discrete I/Q signal.

In accordance with a first aspect of the present invention, this object is achieved by an I/Q modulator for processing a time-discrete I/Q signal comprising an I component and a Q component which is substantially orthogonal thereto, the I/Q signal being based on a sampling frequency which is equal to substantially four times a carrier frequency of a carrier signal onto which the I/Q signal is to be modulated, said I/Q modulator comprising: predistortion means for predistorting the I component and the Q component with a predistortion signal which depends on the I component and the Q component and which comprises a first predistortion component and a second predistortion component, the predistortion means being arranged for forming a predistorted I component as a difference between the I component multiplied by the first predistortion component and the Q component multiplied by the second predistortion component and for forming, in temporal alternation therewith, a predistorted Q component as a sum of the I component multiplied by the second predistortion component and of the Q component multiplied by the first predistortion component, so as to obtain a predistorted output signal and means for adjusting the signs of the temporally alternating predistorted I components and predistorted Q components of the predistorted output signal so that two temporally successive predistorted components have a first sign and two additional successive predistorted components, which follow said first-mentioned components in time, have a second sign, which is inverse to said first sign, so as to produce an output signal at an output of the I/Q modulator.

In accordance with a second aspect of the present invention, this object is achieved by An I/Q modulator for processing a time-discrete I/Q signal comprising an I component and a Q component which is substantially orthogonal thereto, the I/Q signal being based on a sampling frequency which is equal to substantially four times a carrier frequency of a carrier signal onto which the I/Q signal is to be modulated, said I/Q modulator comprising: a first multiplier for multiplying the I component by a predistorted first subcomponent of the carrier signal so as to obtain a multiplied I component; a second multiplier for multiplying the Q component by a predistorted second subcomponent of the carrier signal so as to obtain a multiplied Q component; an adder for adding the multiplied I component and the inverted multiplied Q component; and predistortion means for predistorting a carrier signal so as to produce a predistorted carrier signal, which comprises first and second predistorted subcomponents, from a predistortion signal which depends on the I component and on the Q component and which comprises a first predistortion component and a second predistortion component, said predistortion means being arranged for selecting, in temporal alternation, the first predistortion component and the second predistortion component as predistorted first subcomponent of the carrier signal, wherein in a group of four temporally successive selected predistortion components for the predistorted first subcomponent of the carrier signal the signs of the second and third selected predistortion components of said group are inverted, and said predistortion means being additionally arranged for selecting, in temporal alternation, the second predistortion component and the first predistortion component as predistorted second subcomponent of the carrier signal, wherein in a group of four temporally successive selected predistortion components for the predistorted second subcomponent of the carrier signal the signs of the third and fourth selected predistortion components of said group are inverted, and wherein the predistorted first subcomponent of the carrier signal is equal to the predistortion component at a time instant at which the predistorted second subcomponent of the carrier signal is not equal.

In accordance with a third aspect of the present invention, this object is achieved by a method of processing a time-discrete I/Q signal comprising an I component and a Q component which is substantially orthogonal thereto, the I/Q signal being based on a sampling frequency which is equal to substantially four times a carrier frequency of a carrier signal onto which the I/Q signal is to be modulated, said method comprising the following steps: predistorting the I component and the Q component with a predistortion signal which depends on the I component and the Q component and which comprises a first predistortion component and a second predistortion component, the predistortion being carried out such that a predistorted I component is formed as a difference between the I component multiplied by the first predistortion component and the Q component multiplied by the second predistortion component and that, in temporal alternation therewith, a predistorted Q component is formed as a sum of the I component multiplied by the second predistortion component and of the Q component multiplied by the first predistortion component, so as to obtain a predistorted output signal; and adjusting the signs of the temporally alternating predistorted I components and predistorted Q components of the predistorted output signal so that two temporally successive predistorted components have a first sign and two additional successive predistorted components, which follow said first-mentioned components in time, have a second sign, which is inverse to said first sign, so as to produce an output signal.

In accordance with a fourth aspect of the present invention, this object is achieved by a method of processing a time-discrete I/Q signal comprising an I component and a Q component which is substantially orthogonal thereto, the I/Q signal being based on a sampling frequency which is equal to substantially four times a carrier frequency of a carrier signal onto which the I/Q signal is to be modulated, said method comprising the following steps: multiplying the I component by a predistorted first subcomponent of the carrier signal so as to obtain a multiplied I component; multiplying the Q component by a predistorted second subcomponent of the carrier signal so as to obtain a multiplied Q component; adding the multiplied I component and the inverted multiplied Q component; and predistorting the carrier signal so as to produce a predistorted carrier signal, which comprises first and second predistorted subcomponents, from a predistortion signal which depends on the I component and on the Q component and which comprises a first predistortion component and a second predistortion component, said predistortion being carried out such that the first predistortion component and the second predistortion component are selected, in temporal alternation, as predistorted first subcomponent of the carrier signal, wherein in a group of four temporally successive selected predistortion components for the predistorted first subcomponent of the carrier signal the signs of the second and third selected predistortion components of said group are inverted, and said predistortion being additionally carried out such that the second predistortion component and the first predistortion component are selected, in temporal alternation, as predistorted second subcomponent of the carrier signal, wherein in a group of four temporally successive selected predistortion components for the predistorted second subcomponent of the carrier signal the signs of the third and fourth selected predistortion components of said group are inverted, and wherein the predistorted first subcomponent of the carrier signal is equal to the predistortion component at a time instant at which the predistorted second subcomponent of the carrier signal is not equal.

The present invention is based on the finding that, by selecting a specific sampling ratio of the digital signals in a time-discrete i.e. digital realization of an I/Q modulator, the structure of the digital I/Q modulator can be simplified substantially due to the symmetry properties of the orthogonal subcomponents of the carrier signal, which has the I/Q signal applied thereto.

BRIEF DESCRIPTION OF THE DRAWINGS

In the following, preferred embodiments of the present invention will be explained in detail making reference to the drawings enclosed, in which.

DETAILED DESCRIPTION OF PREFERRED EMBODIMENTS

When an I/Q modulator is digitally realized, all the signals are represented by sampled values at intervals $T_A = 1/f_A$, wherein $f_A$ is the sampling rate and wherein the time $t = nT_A$ and the phase $\Omega_0 = \omega_0 T_A$. n is the time index.

Figure 5A:
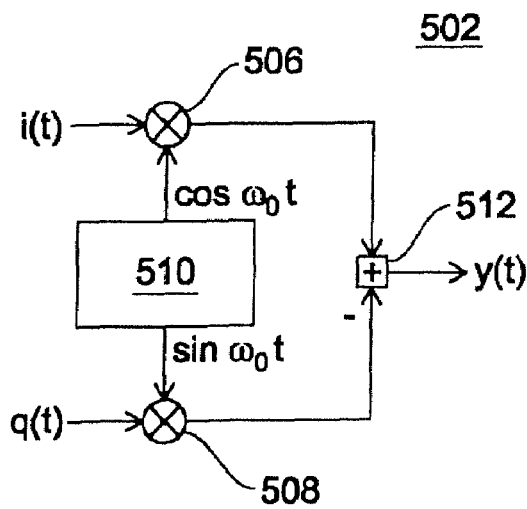
FIGS. 5A, B show the components

An I/Q modulator with predistortion of the I/Q signal according to FIGS. 5A, B, C is then described by the following equations in the time-discrete case:

$$i_p(n) = i(n) \cdot p_1(n) - q(n) \cdot p_2(n) \quad \text{equa. 13}$$

$$q_p(n) = i(n) \cdot p_2(n) + q(n) \cdot p_1(n) \quad \text{equa. 14}$$

$$y(n) = i_p(n) \cdot \cos \Omega_0 n - q_p(n) \cdot \sin \Omega_0 n \quad \text{equa. 15}$$

Making use of time-discrete signals, these equations result from equations 7, 8 and 10 for the I/Q modulator with predistortion of the I/Q signal.

Figure 6:
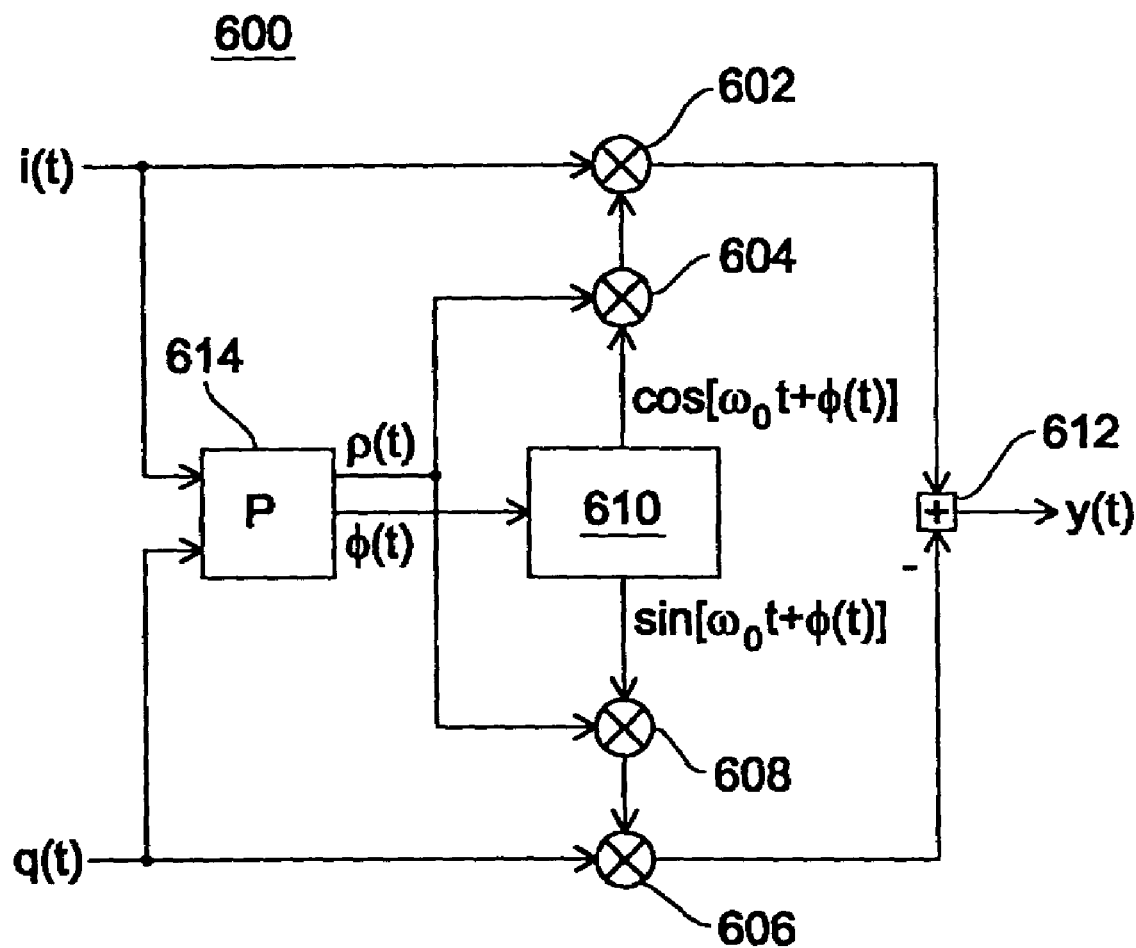
FIG. 6 shows an I/Q modulator with predistortion of the carrier signal.

An I/Q modulator with predistortion of the carrier signal according to FIG. 6 is, however, described in a time-discrete manner by the following equation:

$$y(n) = i(n) \cdot \rho(n) \cdot \cos[\Omega_0 n + \phi(n)] - q(n) \cdot \rho(n) \cdot \sin[\Omega_0 n + \phi(n)] \quad \text{equa. 16}$$

Making use of time-discrete signals, this equation results from equation 12 for an I/Q modulator with predistortion of the carrier signal.

Since the orthogonal functions cosine and sine are here used for the subcomponents of the carrier signal, the symmetry properties i.e. the periodic properties of these functions can be used for digitally realizing the I/Q modulators. When the sampling rate $f_A$ is chosen to be equal to four times the carrier frequency $f_0$, the following equation is obtained:

$$\Omega_0 = \omega_0 T_A = \frac{2\pi f_0}{f_A} \stackrel{f_A = 4f_0}{=} \frac{\pi}{2} \quad \text{equa. 17}$$

and, consequently:

$$\cos \Omega_0 n = \ldots, 1, 0, -1, 0, \ldots \text{ for } n = \ldots, 0, 1, 2, 3, \ldots \quad \text{equa. 18}$$

$$\sin \Omega_0 n = \ldots, 0, 1, 0, -1, \ldots \text{ for } n = \ldots, 0, 1, 2, 3, \ldots \quad \text{equa. 19}$$

Figure 5B:
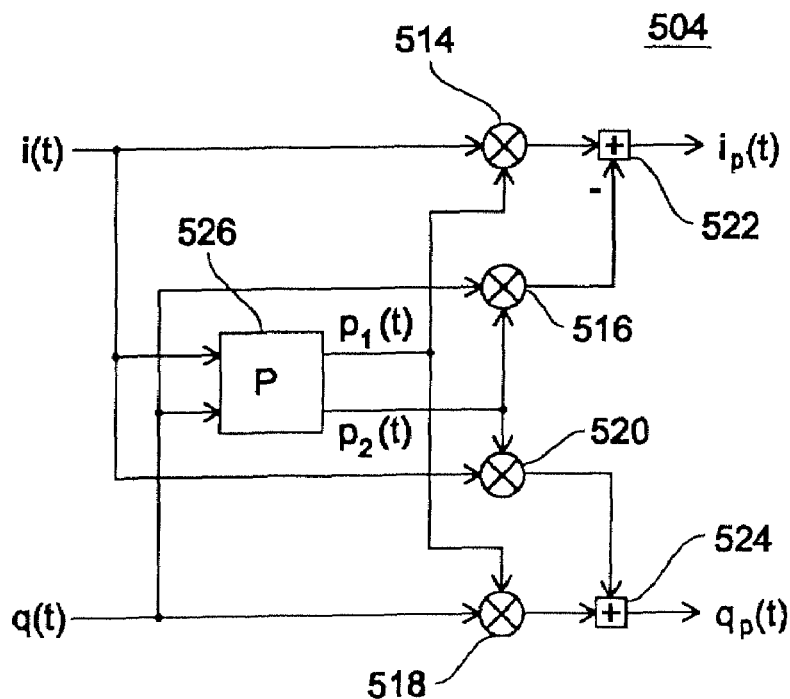
FIG. 5C shows the overall configuration of a conventional I/Q modulator with predistortion of the I/Q signal.
Figure 5C:
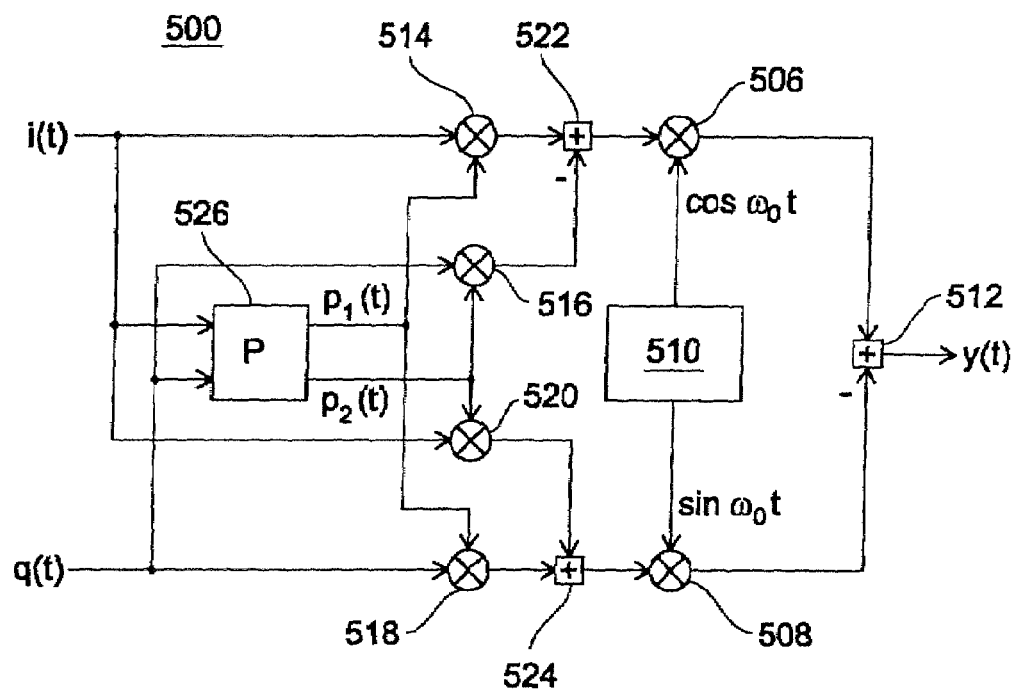

When this selected sampling frequency $f_A$ is taken into account in equation 15 for the output signal of an I/Q modulator 500 with predistortion of the I/Q signal according to FIG. 5C, the following equation is obtained for the output signal in the case of this sampling rate:

$$y(n) = \ldots, i_p(0), -q_p(1), -i_p(2), q_p(3), \ldots \quad \text{equa. 20}$$

$$= \begin{cases} (-1)^{\frac{n}{2}} i_p(n) & n \text{ even} \\ (-1)^{\frac{n+1}{2}} q_p(n) & n \text{ odd} \end{cases}$$

It can be seen that the I component and the Q component of the predistorted I/Q signal according to equation 6 are only required alternately. Hence, the four multipliers of the predistortion means 504 of FIG. 5B can be replaced by two multipliers and two multiplexers, and the two outputs of the predistortion means 504 can be combined so as to form one output. At this output of a resultant predistortion means, the following is obtained:

$$v(n) = \ldots, i_p(0), -q_p(1), -i_p(2), q_p(3), \ldots \text{ for } n = \ldots, 0, 1, 2, 3, \ldots \quad \text{equa. 21}$$

$$= \begin{cases} i_p(n) & n \text{ even} \\ q_p(n) & n \text{ odd} \end{cases}$$

As can be seen from a comparison of equation 20 and equation 21, the means 502 for applying an I/Q signal to a carrier signal according to FIG. 5A is simply implemented as means for adjusting the signs.

Figure 1A:
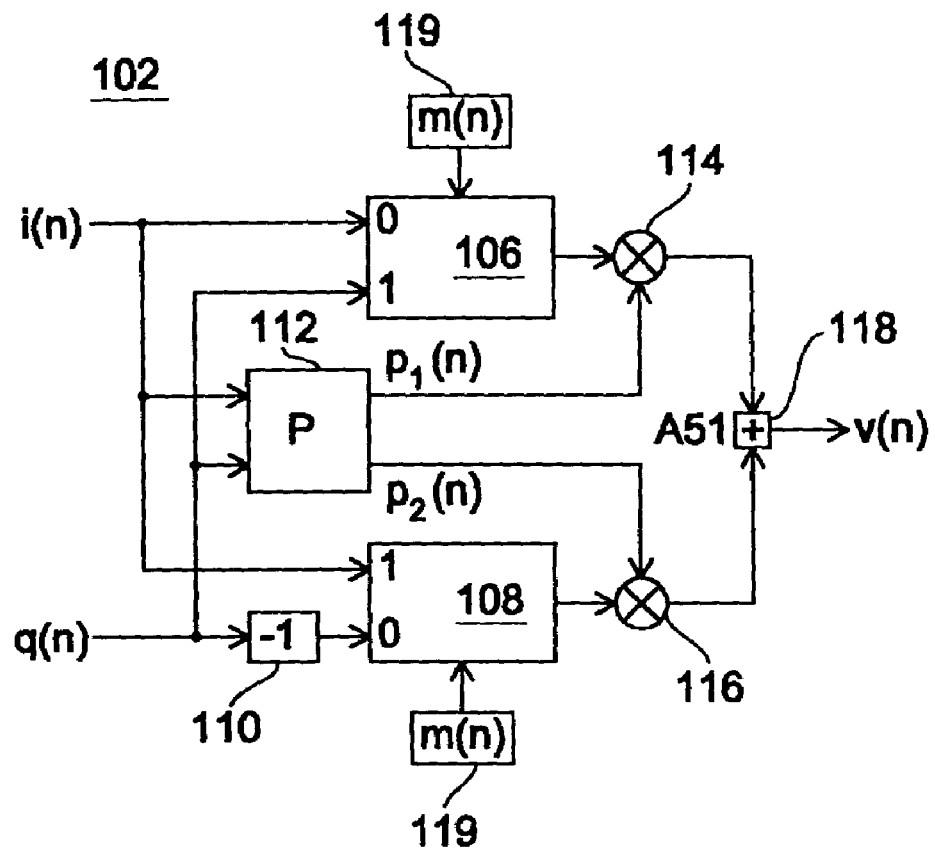
FIGS. 1A and B show the components and FIG. 1C shows the overall configuration of a first embodiment of a digital I/Q modulator with predistortion of the I/Q signal according to the present invention.
Figure 1B:
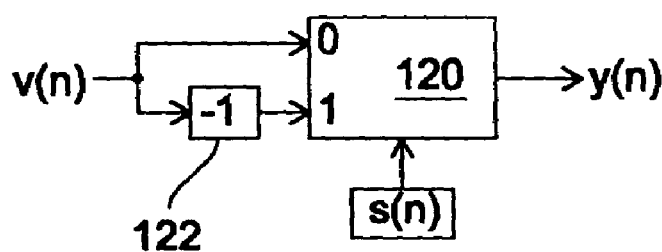
Figure 1C:
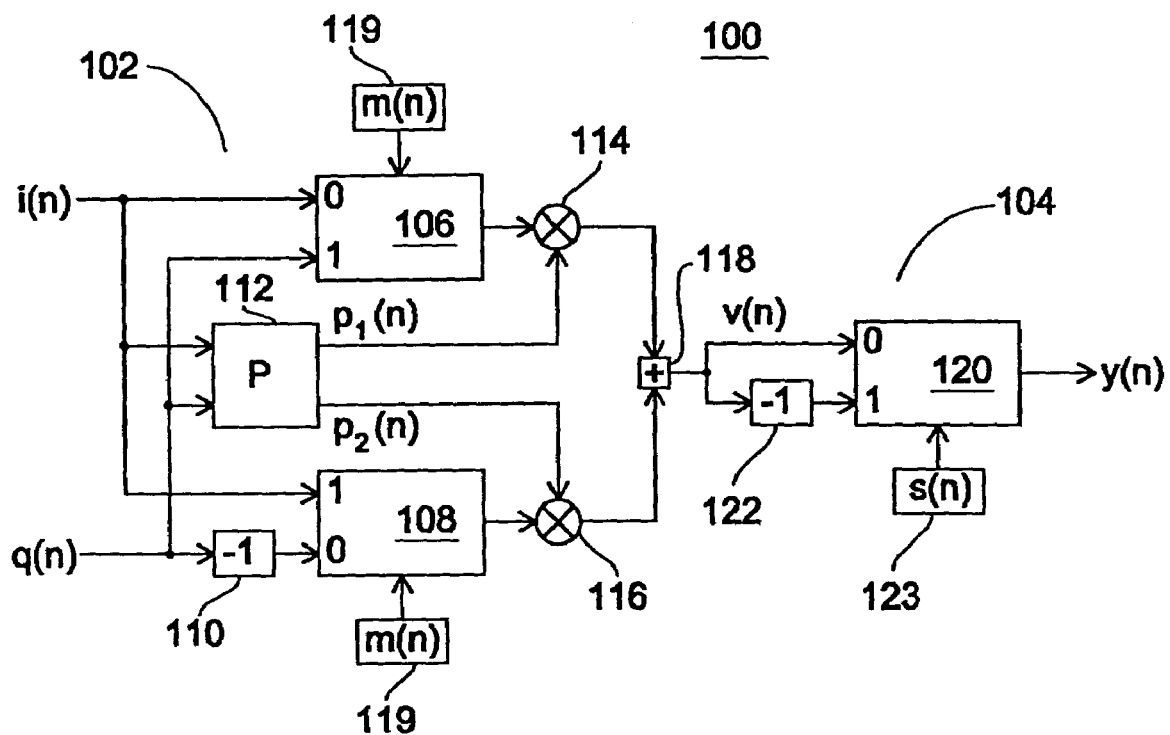

FIGS. 1A and B show the components and FIG. 1C shows the overall configuration of a first embodiment of an I/Q modulator 100 with predistortion of the I/Q signal, said I/Q modulator 100 following from these considerations and comprising a predistortion means 102 according to FIG. 1A and means 104 for adjusting the signs according to FIG. 1B.

FIG. 1A shows the predistortion means 102 of the I/Q modulator with predistortion of the I/Q signal according to the present invention. The predistortion means 102 comprises a first multiplexer 106, a second multiplexer 108, an inverter 110, means 112 for producing a predistortion signal, a first multiplier 114, a second multiplier 116, an adder 118 and a control unit 119.

The first multiplexer 106 comprises a first input connected to a first input of the predistortion means 102, which has the I component of the I/Q signal applied thereto, a second input connected to a second input of the predistortion means 102, which has the Q component of the I/Q signal applied thereto, and an output which is connected to a first input of the first multiplier 114.

The second multiplexer 108 comprises a first input connected to the first input of the predistortion means 102, a second input connected to an output of the inverter 110, and an output connected to a first input of a second multiplier 116. The inverter 110 additionally comprises an input which is connected to the second input of the predistortion means 102.

The means 112 for producing a predistortion signal comprises a first input connected to the first input of the predistortion means 102, a second input connected to the second input of the predistortion means 102, a first output connected to a second input of the first multiplier 114, and a second output connected to a second input of the second multiplier 116.

The first multiplier 114 additionally comprises an output connected to a first input of the adder 118, and the second multiplier 116 additionally comprises an output connected to a second input of the adder 118. The adder 118 comprises an output which constitutes the output of the predistortion means 102 having the output signal applied thereto.

In the following, the mode of operation of the predistortion means 102 according to FIG. 1A will be described briefly. The adder 118 produces alternately according to equation 21 at the output of the predistortion means 102 either the I component $i_p$ or the Q component $q_p$ of the predistortion I/Q signal according to equation 6. In so doing, the adder 118 alternately executes the subtraction according to equation 13 or the addition according to equation 14; for the subtraction according to equation 13, the inverter 110 is switched into the signal path for the second summand of equation 13.

The first multiplexer 106, the first multiplier 114 and the means 112 for producing a predistortion signal produce alternately in dependence upon the time index n either the first summand of equation 13 or the second summand of equation 14, which each contain the first predistortion component $p_1(n)$ of the predistortion signal $p(n)$, i.e. in equation 13 the predistortion of the I component $i(n)$ of the I/Q signal by the first predistortion component $p_1(n)$ of the predistortion signal and in equation 14 the predistortion of the Q component $q(n)$ of the I/Q signal by the first predistortion component $p_1(n)$ of the redistortion signal. The multiplication of the first predistortion component $p_1(n)$ of the predistortion signal with either the I component or the Q component is executed by the first multiplier 114. The selection of either the I component or the Q component for the multiplication of the first multiplier 114 is executed by the first multiplexer 106, which is controlled by a control function m(n) of the control unit 119 depending in the time index n. In dependence upon the control function m(n), the first multiplexer 106 selects among its inputs the input which is addressed by the result of the control function, i,e. the multiplexer 106 selects in dependence upon the control function either the I component at the "0" input, the first input of the first multiplexer 106 which is selected for the result "zero" of the control function, or the Q component at the "1" input, the second input of the first multiplexer 106, which is selected for the result "one" of the control function.

The second multiplexer 108, the second multiplier 116, the inverter 110 and the means 112 for producing a predistortion signal produce again alternately and in dependence upon the time index n either the second summand of equation 13 or the first summand of equation 14, which each contain the second predistortion component $p_2(n)$ of the predistortion signal p(n), i.e. in equation 13 the predistortion of the Q component and in equation 14 the predistortion of the I component of the I/Q signal by the second predistortion component $p_2(n)$ of the predistortion signal. The multiplication of the second predistortion component $p_2(n)$ of the predistortion signal with either the I component or the Q component is carried out by the second multiplier 116. The selection of either the Q component or the I component of the I/Q signal for the multiplication of the second multiplier 116 is carried out by the second multiplexer 108 which is also controlled by the control function m(n) of the control unit 119 in synchronism with the first multiplexer 106. In dependence upon the control function m(n) of the control unit 119, the second multiplexer 108 selects among its inputs the input which is addressed by the result of the control function, i.e. either I component of the I/Q signal at the "1" input or first input of the second multiplexer 108, when the control function m(n) provides the result "one", or the inverted Q component of the I/Q signal at the "0" input or second input of the second multiplexer 108, when the control function m(n) provides the result "zero". The inverter 110 before the "0" input of the second multiplexer 108 provides the negative sign of the subtraction according to equation 13 taking place alternately in the adder 118. The control function m(n) of the control unit 119 for controlling the first multiplexer 106 and the second multiplexer 108 is given by the following equation:

$$m(n)=n\bmod 2= \ldots,0,1,0,1,\ldots \text{ for } n= \ldots,1,2,3,\ldots \quad \text{equa. 22}$$

n mod 2 is the divide remainder of the whole-number division (div) of n divided by 2 (n div 2).

Finally, it should be pointed out that the means 112 for producing a predistortion signal p(n), i.e. the first predistortion component $p_1(n)$ and the second predistortion component $p_2(n)$, respectively adjusts the predistortion signal in dependence upon the I component and the Q component of the predistortion signal.

FIG. 1B shows the means 104 for adjusting the signs of the first embodiment of an I/Q modulator with predistortion of the I/Q signal according to the present invention. As has already been mentioned hereinbefore, the means 502 for applying an I/Q signal to a carrier signal according to FIG. 5A is simply implemented as a means for adjusting the signs, so as to obtain from the output signal v(n) according to equation 21 of the predistortion means 102 of FIG. 1A the output signal y(n) according to equation 20 of the I/Q modulator 100 with predistortion of the I/Q signal according to FIG. 1C.

The means 104 for adjusting the signs comprises a multiplexer 120 having a first and a second input and an output, and an inverter 122 having an input and an output.

The first input of the multiplexer 120 is directly connected to an input of the means 104 for adjusting the signs, whereas the second input of the multiplexer 120 is connected to the output of the inverter 122. The output of the multiplexer 120 is an output of the means 104 for adjusting the signs. Also the inverter 122 has its input connected to the input of the means 104 for adjusting the signs.

In the following, the function of the means 104 for adjusting the signs will be described briefly. Depending on the result of a control function s(n) of a control unit 123, the multiplexer 120 selects either the first input or "0" input, which is associated with the result "zero" of the control function s(n), or the second input or "1" input, which is associated with the result "one" of the control function s(n). In dependence upon the input selected, the output signal v(n) of the predistortion means 102 is either inverted, i.e. the sign is reversed, or it is applied unchanged to the output of the means 104 for adjusting the signs, so as to supply the output signal of the I/Q modulator.

The control function s(n) of the control unit 123, which controls the multiplexer 120, can be derived from the comparison of equations 20 and 21, where the control function s(n) must map equation 21 on equation 20.

$$s(n)=[(n+1)\text{div }2]\bmod 2= \ldots,0,1,1,0,\ldots \text{ for } n= \ldots,0,1,2,3,\ldots \quad \text{equa. 23}$$

The function div in this equation is a whole-number division without any divide remainder, whereas the function mod is the divide remainder of a whole-number division div.

FIG. 1C finally shows the overall configuration of the I/Q modulator 100 which comprises the predistortion means 102 according to FIG. 1A and the means 104 for adjusting the signs according to FIG. 1B.

The advantage of the I/Q modulator 100 according to FIG. 1C is to be seen in the fact that it only requires two multipliers, instead of six multipliers, as shown in FIG. 5C for the conventional I/Q modulator with predistortion of the I/Q signal, and that, consequently, the number of gates as well as the power consumption are reduced.

Taking into account the selection of the sampling frequency according to equation 17 and the resultant consequences according to equations 18 and 19 in equation 16 for the output signal of an I/Q modulator with predistortion of the carrier signal and in equation 11 for the predistorted carrier signal, the following equations are obtained:

$$t_1(n) = \rho(n) \cdot \cos[\Omega_0 n + \phi(n)] = \ldots p_1(0), -p_2(1), -p_1(2), p_2(3), \ldots \quad \text{equa. 24}$$

$$t_2(n) = \rho(n) \cdot \sin[\Omega_0 n + \phi(n)] = \ldots p_2(0), p_1(1), -p_2(2), -p_1(3), \ldots \quad \text{equa. 25}$$

$$y(n) = i(n) \cdot t_1(n) - q(n) \cdot t_2(n) \quad \text{equa. 26}$$

wherein $$p_1(n) = \rho(n) \cdot \cos\phi(n), p_2(n) = \rho(n) \cdot \sin\phi(n) \quad \text{equa. 27}$$

Figure 2:
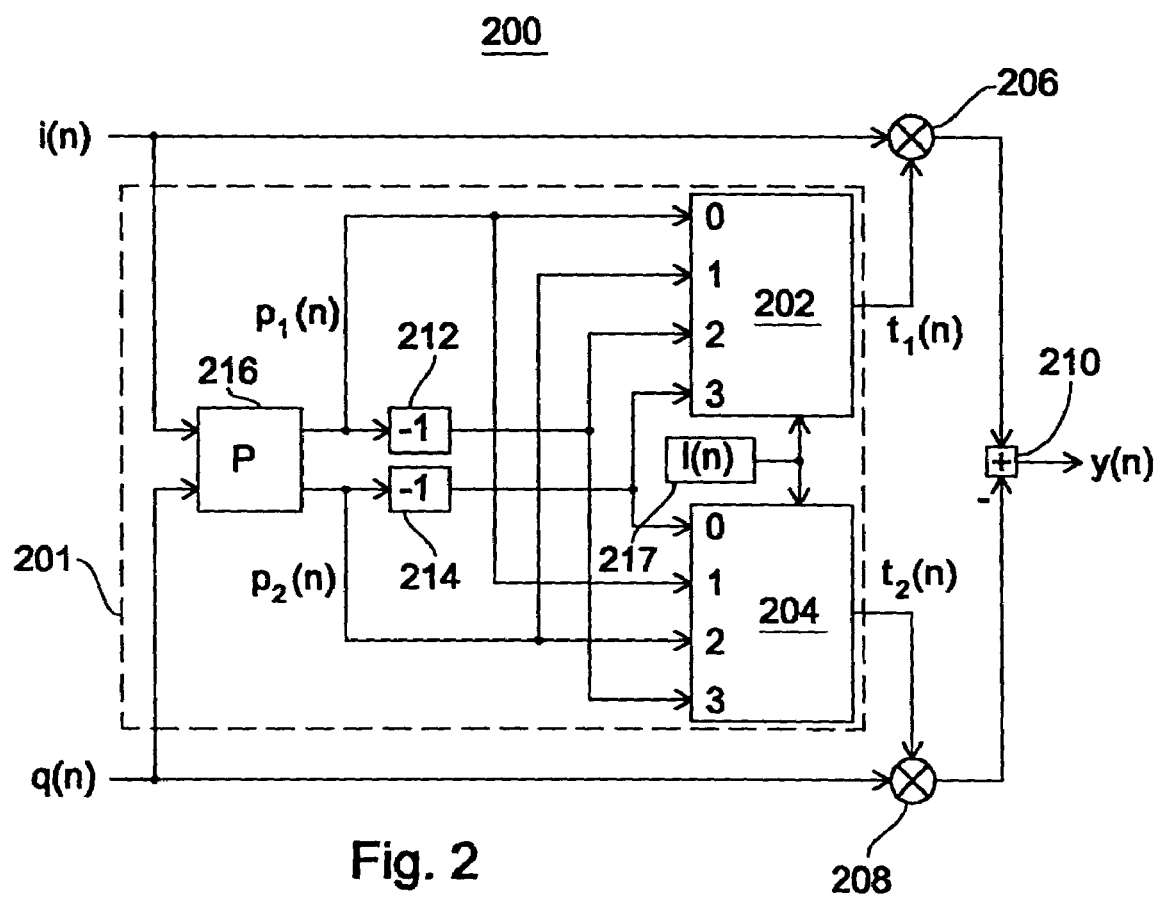
FIG. 2 shows a second embodiment of a digital I/Q modulator with predistortion of the carrier signal according to the present invention.

FIG. 2 shows a second embodiment of an I/Q modulator 200 with predistortion of the carrier signal following from these considerations. The I/Q modulator 200 comprises a first multiplexer 202, a second multiplexer 204, a first multiplier 206, a second multiplier 208, an adder 210, a first inverter 212, a second inverter 214, means 216 for producing a predistortion signal, and a control unit 217. The first multiplexer 202, the second multiplexer 204, the first inverter 212, the second inverter 214, the means 216 for producing a predistortion signal and the control unit 217 define a predistortion means 201 for predistorting a carrier signal.

The first multiplexer 202 comprises a first input, which is connected to a first output of the means 216 for producing a predistortion signal and which has a first predistortion component $p_1(n)$ applied thereto, a second input, which is connected to a second output of the means 216 for producing a predistortion signal and which has a second predistortion component $p_2(n)$ applied thereto, a third output connected to an output of the first inverter 212, a fourth input connected to an output of the second inverter 214, and an output connected to a first input of the first multiplier 206.

The second multiplexer 204 comprises a first input connected to the output of the second inverter 214, a second input connected to the first output of the means 216 for producing a predistortion signal, a third input connected to the second output of the means 216 for producing a predistortion signal, a fourth input connected to the output of the first inverter 212, and an output connected to a first input of the second multiplier 208.

The first multiplier 206 additionally comprises a second input, which is connected to a first input of the I/Q modulator 200 and which has the I component i(n) of the I/Q signal applied thereto, and an output connected to a first input of the adder 210. The second multiplier additionally comprises a second input, which is connected to a second input of the I/Q modulator 200 and which has the Q component q(n) of the I/Q signal applied thereto, and an output connected to a second input of the adder 210.

The adder 210 comprises, in addition to the first and the second input, also an output which is an output of the I/Q modulator 200 having the output signal y(n) of the I/Q modulator applied thereto. The means 216 for producing a predistortion signal additionally comprises a first input connected to the first input of the I/Q modulator 200, and a second input connected to the second input of the I/Q modulator 200. In addition, an input of the first inverter 212 is connected to the first output of the means 216 for producing a predistortion signal, and an input of the second inverter 214 is connected to the second output of the means 216 for producing a predistortion signal.

In the following, the function of the I/Q modulator 200 according to FIG. 2 will be described briefly. The adder 210 forms the difference according to equation 26 so as to produce the output signal y(n) of the I/Q modulator 200. The first multiplier 206 produces the signal at the first input of the adder 210, which is described by the first summand of equation 26 as product of the I component i(n) of the I/Q signal and of the first predistorted subcomponent $t_1(n)$ of the carrier signal, whereas the second multiplier 208 produces the signal at the second input of the adder 210, which is described by the second summand of equation 26 as product of the Q component q(n) of the I/Q signal and of the second predistorted subcomponent $t_2(n)$ of the carrier signal.

The first multiplexer 202 produces the first predistorted subcomponent $t_1(n)$ of the carrier signal which is described by equation 24. As can be seen from equation 24, the predistortion component of the predistortion signal varies with the time index n, i.e. either the first predistortion component $p_1(n)$ or the second predistortion component $p_2(n)$ determining the first predistorted subcomponent $t_1(n)$ of the carrier signal is selected, and also the sign of the respective predistortion component varies with the time index n. The function of the first predistorted subcomponent of the carrier signal in dependence upon n can be realized by a multiplexer with four inputs and one output, i.e. the first multiplexer 202 in FIG. 2, which is controlled by a control function l(n) of the control unit 217. Depending on the result of this control function l(n), the respective input of the first multiplexer 202 assigned to this result is selected and applied to the output of the first multiplexer 202. If the result of the control function is "zero", the "0" input, i.e. the first input of the first multiplexer 202, is selected, which has the predistortion component $p_1(n)$ applied thereto. If the result of the control function is "one", the "1" input, i.e. the second input of the first multiplexer 202, is selected, which has the second predistortion component $p_2(n)$ applied thereto. If the result of the control function is "two", the "2" input, i.e. the third input of the first multiplexer 202, is selected, which has applied thereto the first predistortion component $-p_1(n)$ inverted by the first inverter 212. If the result of the control function is "three", the "3" input, i.e. the fourth input of the first multiplexer 202 is selected, which has applied thereto the second predistortion component $-p_2(n)$ inverted by the second inverter 214. It follows that the assignment of the first predistorted subcomponent $t_1(n)$ of the carrier signal in equation 24 to the first predistortion component $p_1(n)$ and the second predistortion component $p_2(n)$ of the predistortion signal in dependence upon n is described by the control function l(n).

$$l(n) = n \bmod 4 \quad \text{equa. 28}$$

The function mod is the divide remainder of the whole-number division (div).

The second multiplexer 204 in FIG. 2 produces the second predistorted subcomponent $t_2(n)$ of the carrier signal, which is described by equation 25. As can be seen from equation 25, the predistortion component of the predistortion signal varies with the time index n, i.e. either the first predistortion component $p_1(n)$ or the second predistortion component $p_2(n)$ constituting part of the predistortion signal and determining the second predistorted subcomponent of the carrier signal, is selected, and also the sign of the respective predistortion component varies with the time index n. The function of the second predistorted subcomponent $t_2(n)$ of the carrier signal in dependence upon n can again be realized by a multiplexer with four inputs and one output, i.e. here the second multiplexer 204 in FIG. 2, which is again controlled by the control function l(n) of the control unit 217 in synchronism with the first multiplexer 202. Depending on the result of this control function l(n), the respective input of the second multiplexer 204 assigned to this result is selected and applied to the output of the second multiplexer 204. If the result of the control function l(n) is "zero", the "0" input, i.e. the first input of the second multiplexer 204, is selected, which has applied thereto the second predistortion component $-p_2(n)$ inverted by the second inverter 214. If the result of the control function is "one", the "1" input, i.e. the second input of the second multiplexer 204, is selected, which has the first predistortion component $p_1(n)$ applied thereto. If the result of the control function is "two", the "2" input, i.e. the third input of the second multiplexer 204, is selected, which has the second predistortion component $p_2(n)$ applied thereto. If the result of the control function is "three", the "3" input, which is the fourth input of the second multiplexer 204, is selected; this input has applied thereto the first predistortion component $-p_1(n)$ inverted by the first inverter 212.

Finally, it should also be pointed out that the means 216 for producing a predistortion signal in FIG. 2 produces the predistortion signal p(n), i.e. the first predistortion component $p_1(n)$ and the second predistortion component $p_2(n)$, in dependence upon at least the I and the Q components i(n), q(n) of the I/Q signal. The first predistortion component $p_1(n)$ is applied to the first output of the means 216 for producing the predistortion signal, and the second predistortion component $p_2(n)$ is applied to the second output of the means 216 for producing the predistortion signal.

An advantage of the digital I/Q modulator 200 according to FIG. 2 is to be seen in the fact that, in comparison with the conventional I/Q modulator with predistortion of the I/Q signal according to FIG. 5C, it requires only two, instead of six, multipliers and that, consequently, the number of gates as well as the power consumption are reduced.

Figure 3:
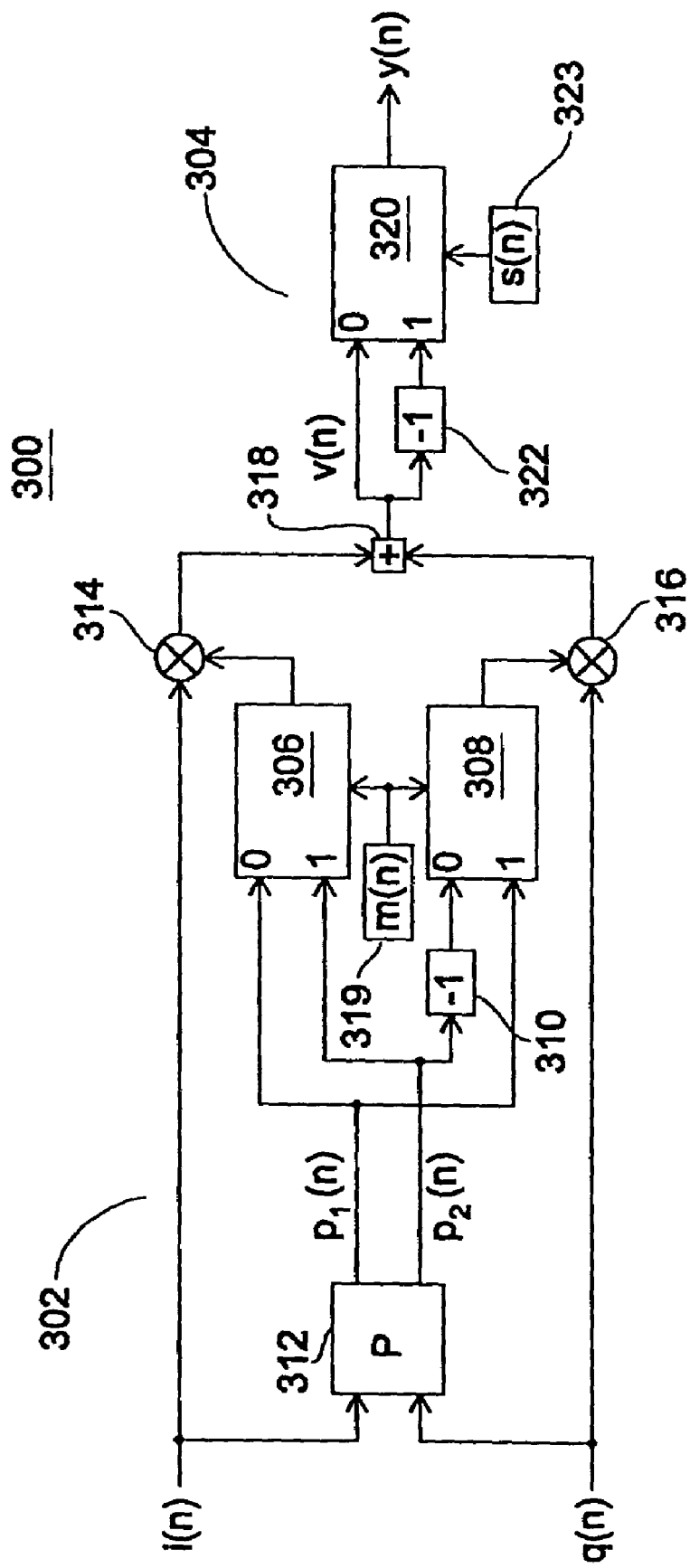
FIG. 3 shows a third embodiment of a digital I/Q modulator with predistortion of the carrier signal according to the present invention.

FIG. 3 shows a third embodiment of a digital I/Q modulator with carrier predistortion, which can be derived from the I/Q modulator 200 of FIG. 2. The I/Q modulator 300 of FIG. 3 comprises, similar to the I/Q modulator 100 of FIG. 1C and FIGS. 1A, B, a predistortion means 302 and means 304 for adjusting the signs. The means 304 for adjusting the signs is here not described, since it is identical to the means 104 for adjusting the signs according to FIG. 1B and since the multiplexer 320 thereof also uses the control function s(n) according to equation 23. In the following, the configuration and the function of the predistortion means 302 will, however, be described.

The predistortion means 302 of the I/Q modulator 300 comprises a first multiplexer 306, a second multiplexer 308, an inverter 310, means 312 for producing a predistortion signal, a first multiplier 314, a second multiplier 316, an adder 318 and a control unit 319.

The first multiplier 306 comprises a first input, which is connected to a first output of the means 312 for producing a predistortion signal and which has the first predistortion component $p_1(n)$ of the predistortion signal applied thereto, a second input, which is connected to a second output of the means 312 for producing a predistortion signal and which has the second predistortion component $p_2(n)$ of the predistortion signal applied thereto, and an output connected to a first input of the first multiplier 314.

The second multiplier 308 comprises a first input connected to an output of the inverter 310, a second input connected to the first output of the means 312 for producing a predistortion signal, and an output connected to a first input of the second multiplier 316.

The first multiplier 314 additionally comprises a second input, which is connected to a first input of the I/Q modulator 300 and which has the I component i(n) of the I/Q signal applied thereto, and an output which is connected to a first input of the adder 318. The second multiplier 316 additionally comprises a second input, which is connected to a second input of the I/Q modulator 300 and which has the Q component q(n) of the I/Q signal applied thereto, and an output which is connected to a second input of the adder 318. The adder 318 comprises an output which is an output of the predistortion means 302, and produces from the signals at the first and second inputs thereof the output signal of the predistortion means 302.

The means 312 for producing a predistortion signal, i.e. the first predistortion component $p_1(n)$ and the second predistortion component $p_2(n)$, additionally comprises a first input, which is connected to the first input of the I/Q modulator 300 and which has the I component of the I/Q signal applied thereto, and a second input, which is connected to the second input of the I/Q modulator and which has the Q component of the I/Q signal applied thereto. Finally, an input of the inverter 310 is connected to the second output of the means 312 for producing a predistortion signal.

The adder 318 performs at a time instant or time index n the subtraction according to equation 13 and at another, subsequent time instant the addition according to equation 14 so that, as can be seen from equation 21, the output of the predistortion means 302 has alternately applied thereto either the I component $i_p(n)$ or the Q component $q_p(n)$ of the predistorted I/Q signal according to equation 6.

It follows that the first multiplier 314 alternately performs the multiplication of the first summand according to equation 13, i.e. the multiplication of the I component i(n) of the I/Q signal with the first predistortion component $p_1(n)$ of the predistortion signal, and the multiplication of the first summand according to equation 14, i.e. the multiplication of the I component i(n) of the I/Q signal with the second predistortion component $p_2(n)$ of the predistortion signal.

In a similar way, the second multiplier 316 alternately performs the multiplication of the second summand according to equation 13, i.e. the multiplication of the Q component q(n) of the I/Q signal with the second predistortion component $p_2(n)$ of the predistortion signal, and the multiplication of the second summand according to equation 14, i.e. the multiplication of the Q component q(n) of the I/Q signal with the first predistortion component $p_1(n)$ of the predistortion signal.

The first multiplier 306 performs the selection of the predistortion component, here $p_1(n)$ or $p_2(n)$, used for the first summands of equation 13 and equation 14, i.e. it causes the above-described alternating multiplication of the first multiplier 314. Depending on the value of a control function m(n) of the control unit 319, the first multiplexer 306 selects either the first or the second input of the first multiplexer 306 and thus either the first or the second predistortion component of the predistortion signal. If the value of the control function m(n) depends on n zero, the "0" input, i.e. the first input of the first multiplexer 306, which has the first predistortion component $p_1(n)$ applied thereto, will be selected. If the value of the control function is "one", the "1" input, i.e. the second input of the first multiplexer 306, which has the second predistortion component $p_2(n)$ applied thereto, will be selected. The control function m(n) for alternating equation 13 with equation 14 corresponds to the control function m(n) according to equation 22.

The second multiplier 308 performs the selection of the predistortion component, here $p_2(n)$ or $p_1(n)$, used for the second summands of equation 13 and equation 14, i.e. it causes the above-described alternating multiplication of the second multiplier 316. Depending on the value of the control function m(n) of the control unit 319, the second multiplexer 308 selects, in synchronism with the first multiplexer 306, either the first or the second input of the second multiplexer 308. If the value of the control function m(n) depends on n zero, the "0" input, i.e. the first input of the second multiplexer 308, which has the inverted second predistortion component $-p_2(n)$ of the predistortion signal applied thereto, will be selected. If the value of the control function is "one", the "1" input, i.e. the second input of the second multiplexer 308, which has the first predistortion component $p_I(n)$ of the predistortion signal applied thereto, will be selected.

An advantage of the I/Q modulator 300 with carrier predistortion according to the third embodiment of the present invention is to be seen in the fact that, in comparison with a conventional I/Q modulator with predistortion of the I/Q signal, it comprises only two, instead of six, multipliers, and that, consequently, the number of gates as well as the power consumption are reduced.

The means 112, 216 and 312 for producing a predistortion signal in FIGS. 1, 2 and 3, which serve to produce the predistortion signal, i.e. the first predistortion component and the second predistortion component, produce the predistortion signal $\underline{p}(t)$ at least in dependence upon the I and Q components i(t), q(t) of the I/Q signal.

$$\underline{p}(t) = \underline{p}[\underline{x}(t)] = \underline{p}[i(t), q(t)] \qquad \text{equa. 29}$$

Figure 4:
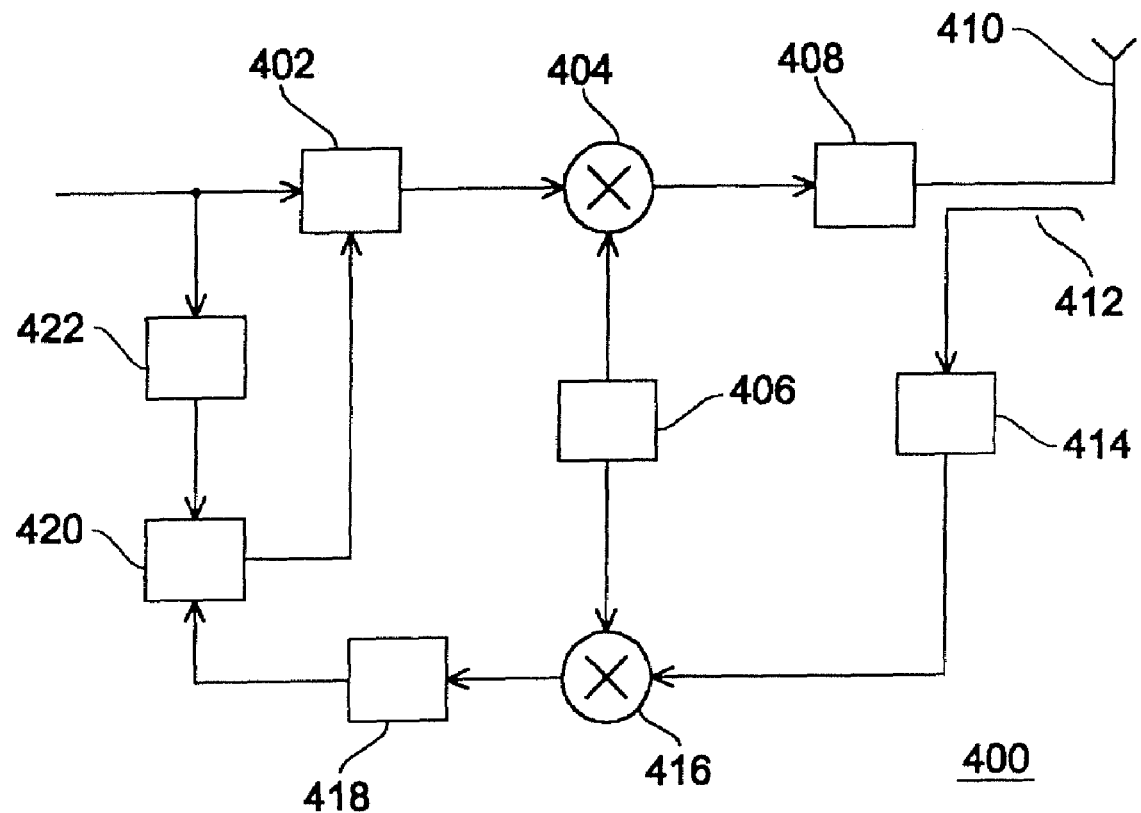
FIG. 4 shows a conventional transmitting means comprising an I/Q modulator with predistortion.

The respective means for producing a predistortion signal may be a table which, depending on the condition of the I/Q signal, i.e. the amplitude of the I/Q signal, is addressed so as to output the first and second predistortion components. The table can, however, also be addressed with other optional parameters. In the case of the example of a transmitting means according to FIG. 4, which can have installed therein the I/Q modulator, these other optional parameters may take into account e.g. the temperature dependence, the ageing properties, power variations etc. of the transmitting means and, primarily, of the transmitter amplifier included therein. The table increases in size in accordance with the number of additional optional parameters. The table may also be a dynamic table comprising variable tabular values. The contents of this dynamic table can, e.g. in the case of the transmitting means of FIG. 4, be adjusted in dependence upon a comparison between an original I/Q signal, which has been fed to the distorting elements of the transmitting means following the I/Q modulator, and a signal outputted by these elements, so as to effect the optimum dynamic adjustment of the predistortion of the I/Q signal by means of said table, i.e. by means of the predistortion signal, at any time. As has already been described in FIG. 4, this is carried out e.g. via a feedback and is referred to as adaptive predistortion of the I/Q signal.

Due to their reduced number of multipliers, the I/Q modulators with predistortion of the I/Q signal and with carrier predistortion according to the present invention offer substantial structural advantages in comparison with conventional I/Q modulators with predistortion of the I/Q signal. Structurally simplified and energy-efficient I/Q modulators can be realized.

The invention claimed is:

1. An I/Q modulator for processing a time-discrete I/Q signal comprising an I component and a Q component which is substantially orthogonal thereto, the I/Q signal being based on a sampling frequency which is equal to substantially four times a carrier frequency of a carrier signal onto which the I/O signal is to be modulated, said I/Q modulator comprising:

a predistorter for predistorting the I component and the Q component with a predistortion signal which depends on the I component and the Q component and which comprises a first predistortion component and a second predistortion component, the predistorter being arranged for forming a predistorted I component as a difference between the I component multiplied by the first predistortion component and the Q component multiplied by the second predistortion component and for forming, in temporal alternation therewith, a predistorted Q component as a sum of the I component multiplied by the second predistortion component and of the Q component multiplied by the first predistortion component, so as to obtain a predistorted output signal; and an adjuster for adjusting the signs of the temporally alternating predistorted I components and predistorted Q components of the predistorted output signal so that two temporally successive predistorted components have a first sign and two additional successive predistorted components, which follow said first-mentioned components in time, have a second sign, which is inverse to said first sign, so as to produce an output signal at an output of the I/Q modulator.

2. An I/Q modulator according to claim 1, wherein the predistorter comprises:

a first multiplier for multiplying either the I component or the Q component by the first predistortion component so as to obtain a multiplied first predistortion component;

a second multiplier for multiplying either the inverted Q component or the I component by the second predistortion component so as to obtain a multiplied second predistortion component;

an adder for adding the multiplied first predistortion component and the multiplied second predistortion component so as to produce the predistorted output signal;

a first multiplexer comprising a first and a second input, said first input being adapted to be fed with the I component, and said second input being adapted to be fed with the Q component, and an output coupled to said first multiplier;

a second multiplexer comprising a first and a second input, said first input being adapted to be fed with the inverted Q component, and the second input being adapted to be fed with the I component, and an output coupled to said second multiplier; and a control unit for producing a control signal so as to connect the first or the second input of the first multiplexer and of the second multiplexer with the respective output, said control unit being arranged for producing the control signal as remainder of an integer division of a time index of the time-discrete I/Q signal by 2.

3. An I/Q modulator according to claim 1, wherein the predistorter comprises:
  a first multiplier for multiplying the I component by either the first predistortion component or the second predistortion component of the predistortion signal so as to obtain a multiplied I component;
  a second multiplier for multiplying the Q component by either the inverted second predistortion component or the first predistortion component of the predistortion signal so as to obtain a multiplied Q component;
  an adder for adding the multiplied I component and the multiplied Q component so as to obtain the predistorted output signal;
  a first multiplexer comprising a first and a second input, said first input being adapted to be fed with the first predistortion component, and said second input being adapted to be fed with the second predistortion component, and an output coupled to said first multiplier;
  a second multiplexer comprising a first and a second input, said first input being adapted to be fed with the inverted second predistortion component, and said second input being adapted to be fed with the first predistortion component, and an output coupled to said second multiplier; and
  a control unit for producing a control signal so as to connect the first or the second input of the first multiplexer and of the second multiplexer to the respective output, said control unit being arranged for producing the control signal as remainder of integer division of a time index of the time-discrete I/Q signal by 2.

4. An I/Q modulator according claim 1, wherein the adjuster (104; 304) comprises:
  a multiplexer (120; 320) comprising a first and a second input and an output, said first input being adapted to be fed with the predistorted output signal, and said second input being adapted to be fed with the inverted predistorted output signal of the predistorter (102; 302); and
  a control unit (123; 323) for producing a control signal so as to connect the first or the second input of the multiplexer (120; 320) to the output of the I/Q modulator (100; 300), the control unit (123; 323) being arranged for producing the control signal as a remainder of an integer division of a variable by 2, said variable being equal to the result of an integer division by 2 of the time index, incremented by 1, of the time-discrete I/Q signal.

5. An I/Q modulator for processing a time-discrete I/Q signal comprising an I component and a Q component which is substantially orthogonal thereto, the I/Q signal being based on a sampling frequency which is equal to substantially four times a carrier frequency of a carrier signal onto which the I/Q signal is to be modulated, said I/Q modulator comprising:
  a first multiplier for multiplying the I component by a predistorted first subcomponent of the carrier signal so as to obtain a multiplied I component;
  a second multiplier for multiplying the Q component by a predistorted second subcomponent of the carrier signal so as to obtain a multiplied Q component;
  an adder for adding the multiplied I component and the inverted multiplied Q component; and
  a predistorter for predistorting a carrier signal so as to produce a predistorted carrier signal, which comprises the first predistorted subcomponent and the second predistorted subcomponent, from a predistortion signal which depends on the I component and on the Q component and which comprises a first predistortion component and a second predistortion component, said predistorter being arranged for selecting, in temporal alternation, the first predistortion component and the second predistortion component as predistorted first subcomponent of the carrier signal, wherein in a group of four temporally successive selected predistortion components for the predistorted first subcomponent of the carrier signal the signs of the second and third selected predistortion components of said group are inverted, and said predistorter being additionally arranged for selecting, in temporal alternation, the second predistortion component and the first predistortion component as predistorted second subcomponent of the carrier signal, wherein in a group of four temporally successive selected predistortion components for the predistorted second subcomponent of the carrier signal the signs of the third and fourth selected predistortion components of said group are inverted, and wherein the predistorted first subcomponent of the carrier signal is equal to the predistortion component at a time instant at which the predistorted second subcomponent of the carrier signal is not equal.

6. An I/Q modulator according to claim 5, wherein the predistorter comprises:
  a first multiplexer comprising a first, a second, a third and a fourth input, said first input being adapted to be fed with the first predistortion component, said second input being adapted to be fed with the second predistortion component, said third input being adapted to be fed with the inverted first predistortion component, and said fourth input being adapted to be fed with the inverted second predistortion component, and an output which supplies the first predistorted subcomponent of the carrier signal and which is coupled to the first multiplier;
  a second multiplexer comprising a first, a second, a third and a fourth input, said first input being adapted to be fed with the inverted second predistortion component, said second input being adapted to be fed with the first predistortion component, said third, input being adapted to be fed with the second predistortion component, and said fourth input being adapted to be fed with the inverted first predistortion component, and an output which supplies the second predistorted subcomponent of the carrier signal and which is coupled to the second multiplier; and
  a control unit for producing a control signal so as to connect the first, the second, the third and the fourth input of the first multiplexer and of the second multiplexer to the respective output, said control unit being arranged for producing said control signal as remainder of an integer division of a time index of the time-discrete I/Q signal by 2.

7. An I/Q modulator (100; 200; 300) according to claim 1, wherein the predistorter (102; 201; 302) additionally comprises: means (112; 216; 312) for producing a predistortion signal, which produces the predistortion signal at least in dependence upon the I component and the Q component of the I/Q signal and which comprises a first input that is adapted to be fed with the I component of the I/Q signal, a second input that is adapted to be fed with Q component of the I/Q signal, a first output supplying the first predistortion component of the predistortion signal, and a second output supplying the second predistortion component of the predistortion signal.

8. An I/Q modulator (100; 200; 300) according to claim 7, wherein the means (112; 216; 312) for producing a predistortion signal produces the predistortion signal such that it additionally depends on at least one further parameter which describes the I/Q signal-distorting properties of means comprising the I/Q modulator.

9. An I/Q modulator (100; 200; 300) according to claim 8, wherein the means comprising the I/Q modulator is a transmitter and wherein the at least one parameter takes into account the age dependent and the temperature-dependent distorting properties of the transmitter as well as the distorting properties of the transmitter depending on power variations.

10. An I/Q modulator (100; 200; 300) according to claim 8, wherein the means (112; 216; 312) for producing a predistortion signal adjusts the predistortion signal additionally in dependence upon a comparison between the I/Q signal fed to the I/Q modulator (100; 200; 300) or the predistorted I/Q signal coming from the I/Q modulator and an I/Q signal distorted by the means comprising the I/Q modulator (100; 200; 300).

11. An I/Q modulator (100; 200; 300) according to claim 7, wherein the means (112; 216; 312) for producing a predistortion signal is a table which is addressed by the I component and the Q component of the I/Q signal, or by the I component, the Q component of the I/Q signal and the at least one additional parameter in dependence upon the time index.

12. A method of processing a time-discrete I/Q signal comprising an I component and a Q component which is substantially orthogonal thereto, the I/Q signal being based on a sampling frequency which is equal to substantially four times a carrier frequency of a carrier signal onto which the I/Q signal is to be modulated, said method comprising the following steps:

predistorting the I component and the Q component with a predistortion signal which depends on the I component and the Q component and which comprises a first predistortion component and a second predistortion component, the predistortion being carried out such that a predistorted I component is formed as a difference between the I component multiplied by the first predistortion component and the Q component multiplied by the second predistortion component and that, in temporal alternation therewith, a predistorted Q component is formed as a sum of the I component multiplied by the second predistortion component and of the Q component multiplied by the first predistortion component, so as to obtain a predistorted output signal; and adjusting the signs of the temporally alternating predistorted I components and predistorted Q components of the predistorted output signal so that two temporally successive predistorted components have a first sign and two additional successive predistorted components, which follow said first—mentioned components in time, have a second sign, which is inverse to said first sign, so as to produce an output signal.

13. A method of processing a time-discrete I/Q signal comprising an I component and a Q component which is substantially orthogonal thereto, the I/Q signal being based on a sampling frequency which is equal to substantially four times a carrier frequency of a carrier signal onto which the I/Q signal is to be modulated, said method comprising the following steps:

multiplying the I component by a predistorted first subcomponent of the carrier signal so as to obtain a multiplied I component;

multiplying the Q component by a predistorted second subcomponent of the carrier signal so as to obtain a multiplied Q component;

adding the multiplied I component and the inverted multiplied Q component; and predistorting the carrier signal so as to produce a predistorted carrier signal, which comprises the first predistorted subcomponent and the second predistorted subcomponents ($t_1$, $t_2$), from a predistortion signal which depends on the I component and on the Q component and which comprises a first predistortion component and a second predistortion component, said predistortion being carried out such that the first predistortion component and the second predistortion component are selected, in temporal alternation, as predistorted first subcomponent of the carrier signal, wherein in a group of four temporally successive selected predistortion components for the predistorted first subcomponent of the carrier signal the signs of the second and third selected predistortion components of said group are inverted, and said predistortion being additionally carried out such that the second predistortion component and the first predistortion component are selected, in temporal alternation, as predistorted second subcomponent of the carrier signal, wherein in a group of four temporally successive selected predistortion components for the predistorted second subcomponent of the carrier signal the signs of the third and fourth selected predistortion components of said group are inverted, and wherein the predistorted first subcomponent of the carrier signal is equal to the predistortion component at a time instant at which the predistorted second subcomponent of the carrier signal is not equal.

\* \* \* \* \*